United States Patent
Park et al.

(10) Patent No.: US 10,779,414 B2
(45) Date of Patent: Sep. 15, 2020

(54) ELECTRONIC COMPONENT EMBEDDED PRINTED CIRCUIT BOARD AND METHOD OF MANUFACTURING THE SAME

(71) Applicant: Samsung Electro-Mechanics Co., Ltd., Suwon-si (KR)

(72) Inventors: Ho-Sik Park, Hwaseong-si (KR); Dong-Keun Lee, Seoul (KR); Jae-Hoon Choi, Yongin-si (KR); Sang-Jae Lee, Suwon-si (KR); Sung-Taek Lim, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 632 days.

(21) Appl. No.: 15/003,400

(22) Filed: Jan. 21, 2016

(65) Prior Publication Data

US 2016/0219710 A1 Jul. 28, 2016

(30) Foreign Application Priority Data

Jan. 22, 2015 (KR) .................. 10-2015-0010658

(51) Int. Cl.
*H05K 1/18* (2006.01)
*H01L 23/498* (2006.01)
(Continued)

(52) U.S. Cl.
CPC ....... *H05K 1/187* (2013.01); *H01L 23/49822* (2013.01); *H01L 23/49827* (2013.01); *H01L 23/50* (2013.01); *H01L 23/5389* (2013.01); *H01L 2224/16225* (2013.01); *H01L 2224/32145* (2013.01); *H01L 2224/48091* (2013.01); *H01L 2224/48227* (2013.01); *H01L 2224/73265* (2013.01); *H05K 3/007* (2013.01);
(Continued)

(58) Field of Classification Search
CPC . H05K 1/14; H05K 1/18; H05K 1/181; H01L 23/52–53; H01L 23/5389; H01L 21/00; H01L 21/02
USPC .................. 361/760–790; 174/259–264; 257/685–777
See application file for complete search history.

(56) References Cited

U.S. PATENT DOCUMENTS

| | | | |
|---|---|---|---|
| 6,038,133 A | 3/2000 | Nakatani et al. | |
| 6,876,554 B1* | 4/2005 | Inagaki | H01G 4/224 361/763 |

(Continued)

FOREIGN PATENT DOCUMENTS

| | | |
|---|---|---|
| JP | 11-220262 A | 8/1999 |
| JP | 2000-349225 A | 12/2000 |

(Continued)

OTHER PUBLICATIONS

Japanese Office Action dated Sep. 3, 2019 in counterpart Japanese Patent Application No. 2015-252477 (8 pages in English and 3 pages in Japanese).

*Primary Examiner* — Tuan T Dinh
(74) *Attorney, Agent, or Firm* — NSIP Law

(57) ABSTRACT

A printed circuit board and method thereof include an electronic component embedded in an insulation layer and comprising a connection terminal exposed on a surface of the insulation layer. The printed circuit board and method thereof also include a bump formed on the connection terminal of the electronic component and exposed on the surface of the insulation layer.

13 Claims, 13 Drawing Sheets

(51) Int. Cl.
- *H05K 3/40* (2006.01)
- *H01L 23/538* (2006.01)
- *H05K 3/00* (2006.01)
- *H05K 3/02* (2006.01)
- *H05K 3/46* (2006.01)
- *H05K 3/18* (2006.01)
- *H01L 23/50* (2006.01)

(52) U.S. Cl.
CPC ............ *H05K 3/025* (2013.01); *H05K 3/181* (2013.01); *H05K 3/188* (2013.01); *H05K 3/4007* (2013.01); *H05K 3/4038* (2013.01); *H05K 3/4697* (2013.01)

(56) References Cited

U.S. PATENT DOCUMENTS

| | | | |
|---|---|---|---|
| 6,952,049 B1 | 10/2005 | Ogawa et al. | |
| 8,022,513 B2* | 9/2011 | Hsu | H01L 23/5389 174/260 |
| 8,116,066 B2* | 2/2012 | Inoue | H01L 24/82 361/321.4 |
| 8,796,561 B1* | 8/2014 | Scanlan | H05K 1/185 174/260 |
| 8,867,225 B2* | 10/2014 | Sato | H05K 1/184 361/748 |
| 9,497,863 B2* | 11/2016 | Kusama | H05K 1/185 |
| 2003/0197277 A1* | 10/2003 | Yamamoto | H01L 23/49816 257/772 |
| 2005/0211465 A1* | 9/2005 | Sunohara | H01L 23/5389 174/260 |
| 2006/0003495 A1* | 1/2006 | Sunohara | H01L 21/4857 438/124 |
| 2009/0166885 A1* | 7/2009 | Tay | H01L 23/3135 257/777 |
| 2009/0218118 A1* | 9/2009 | Tani | H01L 23/5389 174/256 |
| 2009/0229872 A1 | 9/2009 | Takaike | |
| 2010/0012364 A1* | 1/2010 | Kim | H01L 24/24 174/260 |
| 2010/0163168 A1* | 7/2010 | Saita | H01L 21/4857 156/247 |
| 2011/0062602 A1* | 3/2011 | Ahn | H01L 21/563 257/787 |
| 2011/0155433 A1* | 6/2011 | Funaya | H01L 23/49827 174/258 |
| 2011/0240354 A1* | 10/2011 | Furuhata | H01L 21/568 174/258 |
| 2012/0087097 A1* | 4/2012 | Hong | H01L 23/5389 361/763 |
| 2013/0009325 A1* | 1/2013 | Mori | H01L 23/5389 257/774 |
| 2013/0319740 A1* | 12/2013 | Sato | H05K 1/185 174/258 |
| 2013/0333930 A1 | 12/2013 | Koyanagi | |
| 2014/0078703 A1* | 3/2014 | Kim | H01L 23/5389 361/761 |
| 2014/0111958 A1 | 4/2014 | Lee | |
| 2014/0151104 A1* | 6/2014 | Chung | H05K 1/186 174/260 |
| 2014/0166343 A1* | 6/2014 | Kim | H05K 1/185 174/251 |
| 2014/0353017 A1* | 12/2014 | Noda | H05K 1/185 174/257 |
| 2015/0156881 A1* | 6/2015 | Shimizu | H05K 3/30 174/255 |
| 2015/0228624 A1* | 8/2015 | Miki | H01L 25/0657 257/778 |

FOREIGN PATENT DOCUMENTS

| | | |
|---|---|---|
| JP | 2005-303260 A | 10/2005 |
| JP | 2009-224616 A | 10/2009 |
| JP | 2011-159695 A | 8/2011 |
| JP | 2014-3087 A | 1/2014 |
| JP | 2014-86721 A | 5/2014 |

\* cited by examiner

ELECTRONIC COMPONENT EMBEDDED PRINTED CIRCUIT BOARD AND METHOD OF MANUFACTURING THE SAME

CROSS-REFERENCE TO RELATED APPLICATIONS

This application claims the benefit under 35 USC 119(a) of Korean Patent Application No. 10-2015-0010658, filed on Jan. 22, 2015, in the Korean Intellectual Property Office, the entire disclosure of which is incorporated herein by reference for all purposes.

BACKGROUND

1. Field

The following description relates to an electronic component embedded printed circuit board and a method of manufacturing the same.

2. Description of Related Art

Generally, a printed circuit board (PCB) has integrated chips or electronic components disposed on a board. The board is made of any of various kinds of thermosetting synthetic resins, on which metal wirings are formed on one surface or both surfaces thereof. The PCB has the integrated chips or the electronic components electrically connected with one another and then coated by an insulation material.

With the market trend of requiring various functions and profile reductions in or compactness of a semiconductor package, various technologies are needed to manufacture the printed circuit board. Accordingly, development of an embedded PCB has received much attention as a possibility for the next-generation multi-functionality and small package technology. The embedded PCB includes passive devices, such as a capacitor, a resistor, and an inductor, which are three basic elements commonly installed on a surface of a PCB to form an electronic circuit. The electronic circuit is embedded in an inner layer of the PCB to allow the passive devices to function within the PCB. The embedded PCB needs to be configured with a reduced a surface area onto which the passive devices are installed, an increased efficiency, and low manufacturing costs of the end product including the PCB. It is desired for the PCB to have improved electrical properties with a decreased inductance caused by a shortened connection distance between active devices and passive devices. Moreover, it is desired for the PCB to be mounted with an increased reliability as a number of soldered joints is reduced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a printed circuit board, including an electronic component embedded in an insulation layer and may include a connection terminal exposed on a surface of the insulation layer; and a bump formed on the connection terminal of the electronic component and exposed on the surface of the insulation layer.

The printed circuit board may further include a circuit layer embedded on the surface of the insulation layer.

The circuit layer may be formed on a same plane as the surface of the insulation layer exposing the connection terminal of the electronic component.

The printed circuit board may further include a solder resist layer formed on both surfaces of the insulation layer.

The solder resist layer may have an opening formed therein to expose the connection terminal of the electronic component.

A surface treatment layer may be formed on the exposed connection terminal of the electronic component.

An adhesive layer may be interposed between the electronic component and the solder resist layer.

The insulation layer may be made of one of a thermosetting or thermoplastic polymer material, a ceramic, an organic or inorganic composite material, a glass fiber prepreg, flame retardant 4 (FR-4), bismaleimide triazine (BT), and an ajinomoto build-up film (ABF).

The printed circuit board may further include a build-up layer laminated on another surface of the insulation layer.

In accordance with an embodiment, there is provided a semiconductor package, may include: a printed circuit board including an electronic component embedded in an insulation layer, wherein the electronic component may include a connection terminal exposed on a surface of the insulation layer, and a bump formed on the connection terminal of the electronic component and exposed on the surface of the insulation layer; and a first device connected to the metal bump.

The semiconductor package may further include: a second device formed on the first device, the second device is wire-bonded with a circuit layer of the printed circuit board.

In accordance with an embodiment, there is provided a method of manufacturing a printed circuit board, may include: forming a circuit pattern on a carrier member; installing an electronic component in a device installation area having the circuit pattern formed therein; forming an insulation layer to embed the electronic component therein; removing the carrier member; forming a circuit layer on both surfaces of a laminate from which the carrier member is removed to expose a connection terminal on one side of the electronic component; and forming a bump on the exposed connection terminal of the electronic component.

The forming of the circuit pattern may include: forming a first dry film on the carrier member and etching the first dry film in a pattern; filling a metallic material in the etched pattern; and removing the first dry film and forming an adhesive layer in an area in which the electronic component is formed.

The forming of the insulating layer may include: forming a first insulation layer on the carrier member to surround lateral surfaces of the electronic component; and forming a second insulation layer on the first insulation layer.

The insulation layer may be made of one of a thermosetting or thermoplastic polymer material, a ceramic, an organic or inorganic composite material, a glass fiber prepreg, flame retardant 4 (FR-4), bismaleimide triazine (BT) and an ajinomoto build-up film (ABF).

The forming of the circuit layer may include: removing the carrier member and processing a via hole including a micro via hole to expose the connection terminal of the electronic component on the insulation layer; forming a second dry film on one surface and another surface of the insulation layer, patterning the second dry film to expose the via hole; and filling a metallic material in the exposed via hole.

The method may further include: forming a surface treatment layer on the exposed connection terminal of the electronic component.

The method may further include laminating a build-up layer on another surface of the insulation layer.

In accordance with an embodiment, there is provided a method of manufacturing a semiconductor package, may include: forming of the printed circuit board includes forming a circuit pattern on a carrier member, installing an electronic component in an area having the circuit pattern formed therein, forming an insulation layer to embed the electronic component therein, removing the carrier member, forming a circuit layer on both surfaces of a laminate from which the carrier member is removed to expose a connection terminal on one side of the electronic component, and forming a bump on the exposed connection terminal of the electronic component; and connecting a first device to the metal bump.

The method may further include: forming a second device on the first device, wherein the second device is wire-bonded with the circuit layer of the printed circuit board.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
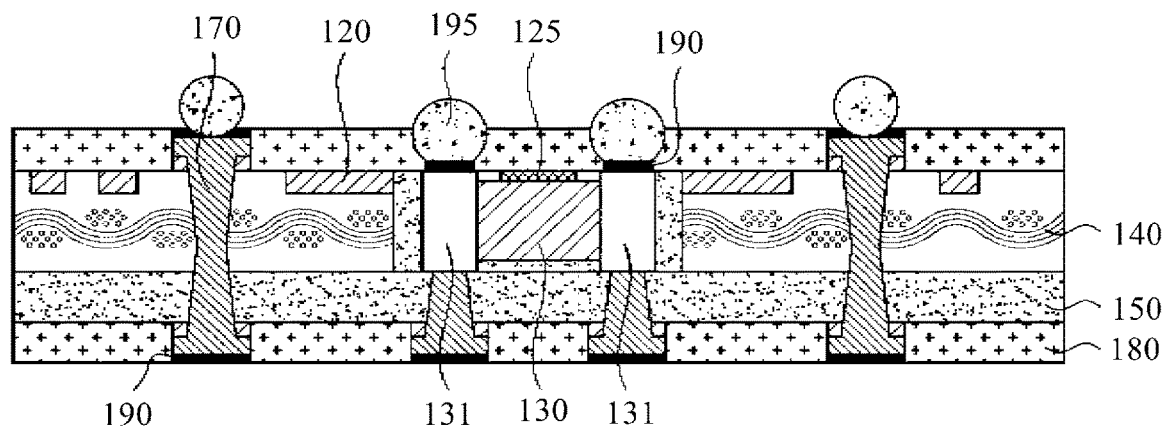
FIG. 1 is a cross-sectional view illustrating an example of an electronic component embedded printed circuit board, in accordance with an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless otherwise defined, all terms, including technical terms and scientific terms, used herein have the same meaning as how they are generally understood by those of ordinary skill in the art to which the present disclosure pertains. Any term that is defined in a general dictionary shall be construed to have the same meaning in the context of the relevant art, and, unless otherwise defined explicitly, shall not be interpreted to have an idealistic or excessively formalistic meaning.

Identical or corresponding elements will be given the same reference numerals, regardless of the figure number, and any redundant description of the identical or corresponding elements will not be repeated. Throughout the description of the present disclosure, when describing a certain relevant conventional technology is determined to evade the point of the present disclosure, the pertinent detailed description will be omitted. Terms such as "first" and "second" can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

Hereinafter, various embodiments will be described in detail with reference to the accompanying drawings.

FIG. 1 is a cross-sectional view illustrating an example of an electronic component embedded printed circuit board, in accordance with an embodiment. As illustrated in FIG. 1, an electronic component embedded printed circuit board includes a circuit layer 120, an adhesive layer 125, an electronic component 130, a first insulation layer 140, a second insulation layer 150, a solder resist layer 180, a surface treatment layer 190 and a metal bump 195.

The circuit layer 120 is embedded in the first insulation layer 140 in such a manner that one surface thereof is exposed, and is connected to a connection terminal 131 of the electronic component 130 through a connection pattern.

In this example, the circuit layer 120 is formed by coating a dry film on a carrier member that is removed through a separation process, and then by patterning an opening to form a circuit.

In one example, the adhesive layer 125 is formed on a same plane as the circuit layer 120 using an epoxy non-conductive adhesive material, which sturdily adheres the electronic component 130 to the carrier member. In this example, an area occupied by the adhesive layer 125 is minimized by controlling an amount of coating lest that the adhesive layer 125 runs over to an area of the connection terminal 131.

The electronic component 130, which is electrically connected in the electronic component embedded printed circuit board to carry out a particular function, is an active device, such as a semiconductor device, or a passive device, such as a capacitor, a resistor, or an inductor. In this example, an active surface of the electronic component 130 coincides with a surface of the first insulation layer 140, and is directly connected by plating a connection pattern on the connection terminal 131, without forming a via hole. In an example, the active surface of the electronic component 130 coincides with a surface of the first insulation layer 140. Both surfaces coinciding may refer to a perfect alignment of both surfaces or with a marginal tolerance caused by a process error, possibly occurred during a manufacturing process.

The active surface of the electronic component 130 generally refers to an outermost surface including the connection terminal 131. For instance, in a case in which the connection terminal 131 is embedded in the first insulation layer 140, the active surface of the electronic component 130 is an exposed surface facing the first insulation layer 140. In this example, because the active surface of the electronic component 130 coincides with one surface of the first insulation layer 140, there is no need for a via, unlike conventional manufacturing methods. As a result, a connection reliability of the connection terminal 131 improved and a manufacturing cost of the electronic component embedded printed circuit board is lower, owing to the omission of laser processing.

In one embodiment, the first insulation layer 140 and the second insulation layer 150 each have a via formed therein for the first insulation layer 140 and the second insulation layer 150 to respectively penetrate there through. Moreover, the second insulation layer 150 has a micro-via formed therein to connect with the connection terminal of the electronic component 130 embedded in the first insulation layer 140.

The first insulation layer 140 is formed using a prepreg. The electronic component 130 is installed in the first insulation layer 140 after punching the first insulation layer 140 at an area where the electronic component 130 is to be installed. In this example, using a method of manufacturing a coreless type of printed circuit board, the first insulation layer 140 is formed by processing a primary lay-up by pre-punching an insulation material at an area where a component is to be installed.

The second insulation layer 150 is formed on one surface of the first insulation layer 140 and is configured to embed and stabilize the electronic component 130 formed in the first insulation layer 140. Accordingly, the second insulation layer 150 is made of an insulation material having a fluid property, such as, a semi-hardened insulation material. In this example, the first insulation layer 140 and the second insulation layer 150 are formed as a prepreg layer, and are made of a thermosetting or thermoplastic polymer material, a ceramic, an organic or inorganic composite material, or any resin having glass fiber impregnated therein. In a case where the first insulation layer 140 and the second insulation layer 150 are made of a polymer resin, the polymer resin includes an epoxy insulation resin, for example, flame retardant 4 (FR-4), bismaleimide triazine (BT) or an ajinomoto build-up film (ABF). Alternatively, the polymer resin may include a polyimide resin, but other resins may form the first insulation layer 140 and the second insulation layer 150.

The solder resist layer 180, which is a heat-resistant coating material, is configured to protect an outer circuit layer 170 such that solder is not coated on the outer circuit layer 170 during soldering. In an embodiment, the solder resist layer 180 has an opening formed therein to electrically connect to an external circuit such that the pad and the connection terminal of the electronic component are exposed.

The surface treatment layer 190 is configured to prevent the exposed outer circuit layer 170 from oxidation and to improve a solderability and a conductivity of the electronic component 130. In one example, the surface treatment layer 190 is made of a gold plated film, an electrolytic gold plated film, an electroless gold plated film, or an electroless nickel immersion gold (ENIG) film.

The metal bump 195, which is made of a conductive solder on the surface treatment layer 190, is bonded with a connection pad of an electronic component above the metal bump 195. In one embodiment, a bonding area of a counterpart component, such as the electronic component above the metal bump 195, and the conductive solder of the metal bump 195 are bonded to each other through a thermal compression method at a predetermined temperature, allowing a lamination between semiconductor chips or allowing a semiconductor chip to be conductively connected to the PCB.

Figure 2:
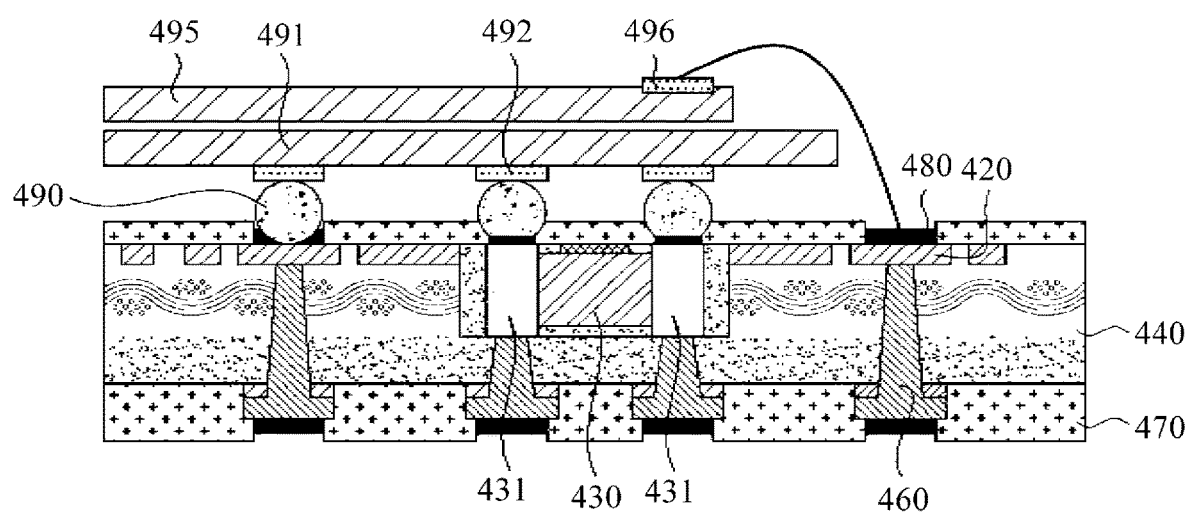
FIG. 2 is a cross-sectional view illustrating a package structure having an electronic device installed on the electronic component embedded printed circuit board, in accordance with an embodiment.
Figure 3:
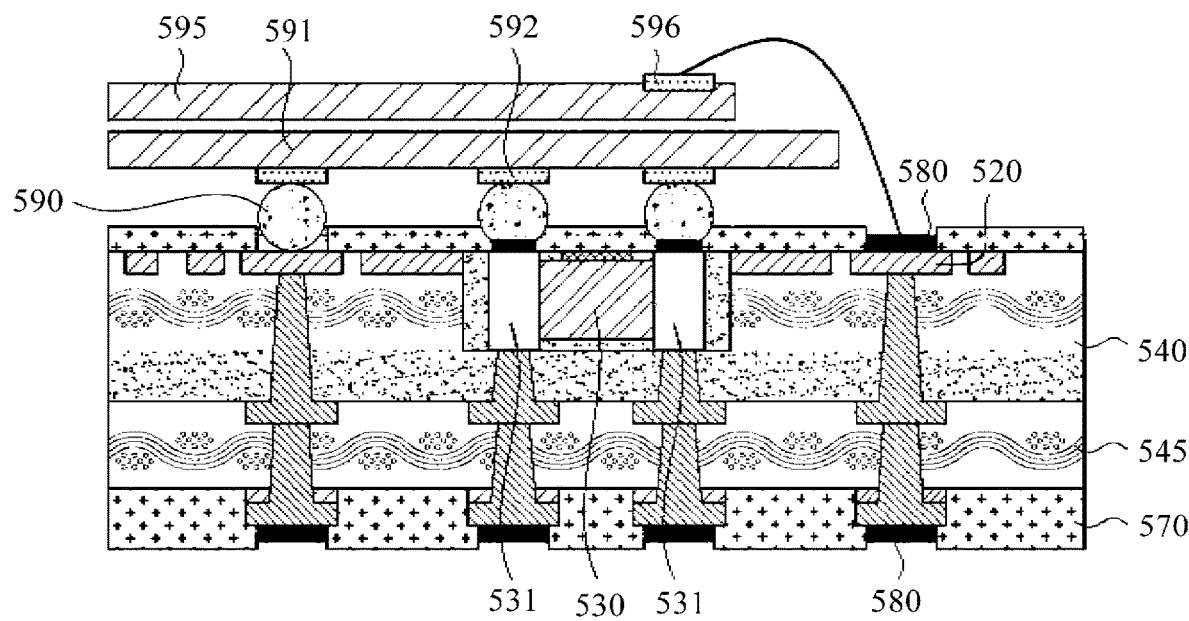
FIG. 3 is a cross-sectional view illustrating a package structure having a build-up layer disposed on a surface of the electronic component embedded printed circuit board, in accordance with an embodiment.

FIG. 2 is a cross-sectional view illustrating a package structure having an electronic device installed on the electronic component embedded printed circuit board, in accordance with an embodiment. FIG. 3 is a cross-sectional view illustrating a package structure having a build-up layer disposed on one surface of the electronic component embedded printed circuit board, in accordance with an embodiment.

As illustrated in FIG. 2, a semiconductor package of a printed circuit board includes an electronic component embedded printed circuit board, a first electronic device 491, and a second electronic device 495.

The electronic component embedded printed circuit board in this example is the same or similar to the electronic component embedded printed circuit board described in the above example.

The first electronic device 491 is formed above the electronic component embedded printed circuit board and is connected through a metal bump 490 of the printed circuit board via a connection pad 492 formed therebetween.

The second electronic device 495 is disposed or positioned above the first electronic device 491, and a connection pad 496 is formed at a bonding area of the second electronic device 495. The connection pad 496 is wire-bonded to a connection pad 480 that is exposed at the printed circuit board.

In this example, descriptions of any configurations that are same as examples previously described above will be omitted.

As illustrated in FIG. 3, the electronic component embedded printed circuit board, according to an illustrative embodiment, also includes a build-up layer 545 in addition to the printed circuit board having multilayered substrates formed thereon as shown in FIG. 2. The build-up layer 545 is laminated on one surface of an insulation layer 540. The build-up layer 545 is formed and completed by laminating an additional insulation material, forming a via hole by use of a YAG layer or a $CO_2$ laser, and then forming a circuit layer including a via through a semi-additive process (SAP) or a modified semi-additive process (MSAP). Although FIG. 3 illustrates that one layer of the build-up layer 545 is additionally formed on one surface of the insulation layer 540, the electronic component embedded printed circuit board is not limited to having a two-layer structure. A person skilled in the art will appreciate that a structure having two or more layers of the build-up layer 545 may be also embodied based on or using the various examples previously described.

Figure 4:
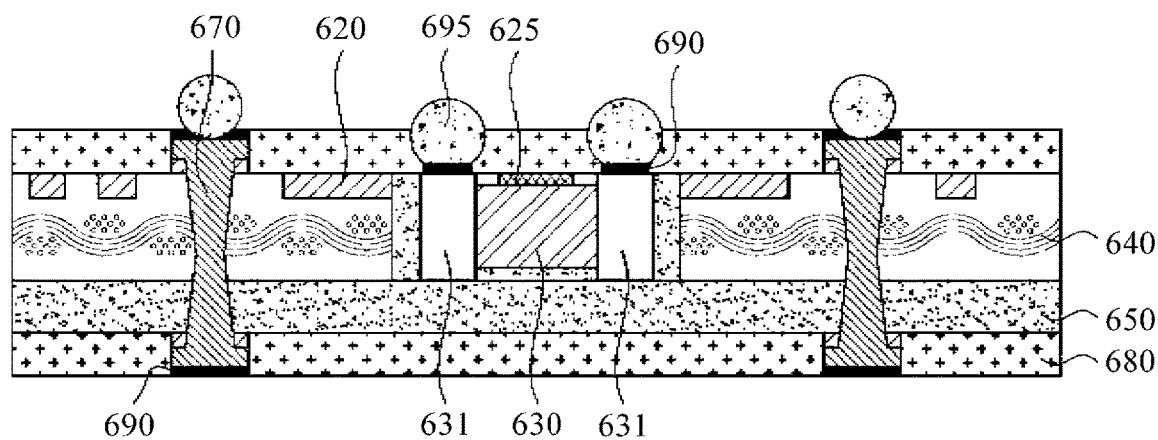
FIG. 4 is a cross-sectional view illustrating another example of an electronic component embedded printed circuit board, in accordance with an embodiment.

FIG. 4 is a cross-sectional view illustrating another example of an electronic component embedded printed circuit board, in accordance with an embodiment. In the electronic component embedded printed circuit board illustrated in FIG. 4, a connection terminal 631 of an active surface of an electronic component 630 is exposed on an outermost layer to coincide with one surface of a first insulation layer 640, and there is no via connected with a surface of an electronic component. Moreover, similarly to FIG. 2 and FIG. 3, a multilayered substrate is laminated, or a build-up structure is formed.

FIG. 5A through FIG. 5H illustrate processes used in an example of a method of manufacturing an electronic component embedded printed circuit board, in accordance with an embodiment. FIGS. 5A through 5H illustrate various cross-sectional views of the electronic component embedded printed circuit board during a manufacturing process.

As illustrated in FIG. 5A to FIG. 5H, a method of manufacturing an electronic component embedded printed circuit board, according to an example, includes forming a circuit pattern on a carrier member. An electronic component is installed in a device installation area where the circuit pattern is formed. An insulation layer is formed such that the electronic component is embedded. The carrier member is removed and a circuit layer is formed on both surfaces of a laminate from which the carrier member is removed. As a result, a connection terminal is exposed on one side of the electronic component. A metal bump is formed on the exposed connection terminal of the electronic component.

Figure 5A:
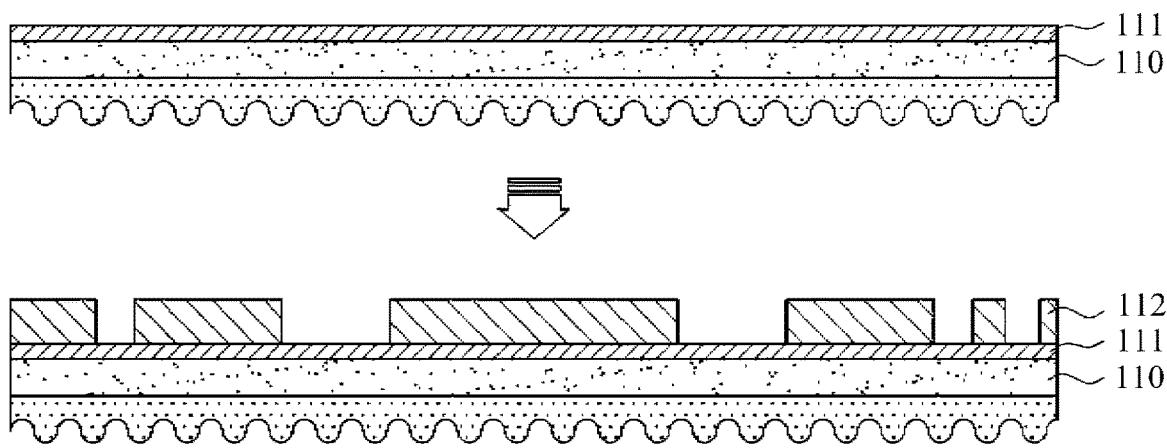
FIG. 5A through FIG. 5H illustrate processes used in an example of a method to manufacture an electronic component embedded printed circuit board, in accordance with an embodiment.

As illustrated in FIG. 5A, an opening for forming a circuit is patterned by coating a first dry film 112 on a carrier member 110 having a seed layer 111 formed thereon. In this example, the first dry film 112 functions as a plating resist, while a circuit layer 120 is formed in a later process. The first dry film 112 is coated by being laminated on the seed layer 111. In detailed processes of patterning the opening to form a circuit, an artwork film is tightly attached to the first dry film 112, and ultraviolet rays are then irradiated to the artwork film to selectively cure the first dry film 112. Uncured portions are then dissolved and removed from the first dry film 112 using sodium carbonate or potassium carbonate.

In this example, the seed layer 111 formed on one surface of the carrier member 110 is formed, for example, using an electroless copper plating process. In an alternative example, the seed layer 111 may be formed using a sputtering process or a chemical vapor deposition (CVD) process.

Figure 5B:
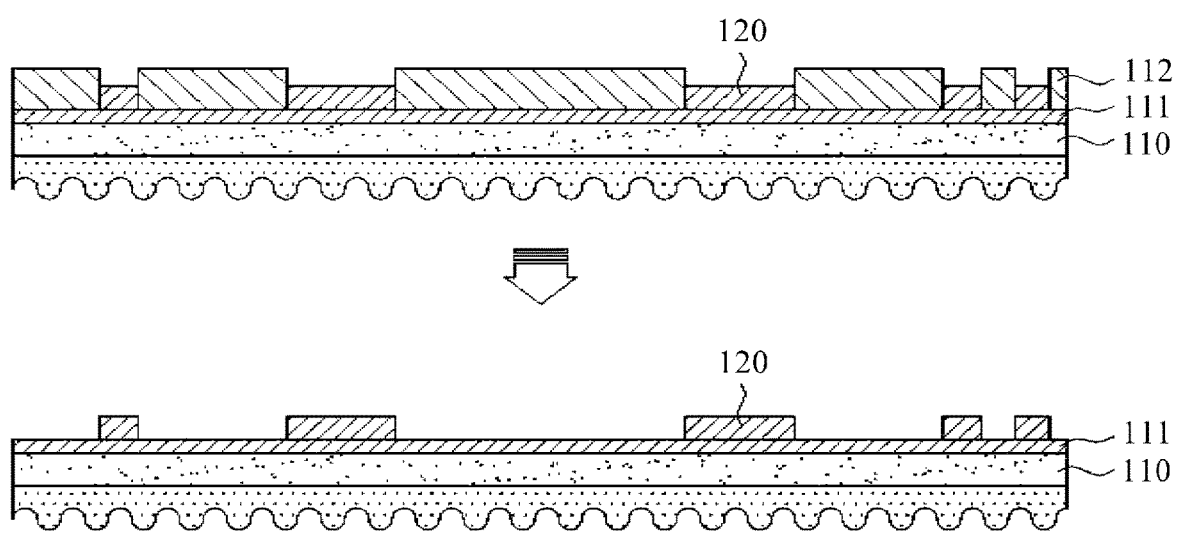

Then, as illustrated in FIG. 5B, a circuit layer 120 is formed in an opening formed on the carrier member 110. The circuit layer 120 is formed by using the seed layer 111 as an electrolytic plating lead. In an embodiment, because the first dry film 112 functions as a plating resist, the circuit layer 120 is selectively formed in the opening of the first dry film 112. Moreover, in one embodiment, because the circuit layer 120 eventually becomes an outer circuit layer, the circuit layer 120 is formed using copper. Once the circuit layer 120 is formed, the first dry film 112 is removed, for example, using a stripping solution such as, for example, NaOH or KOH.

Figure 5C:
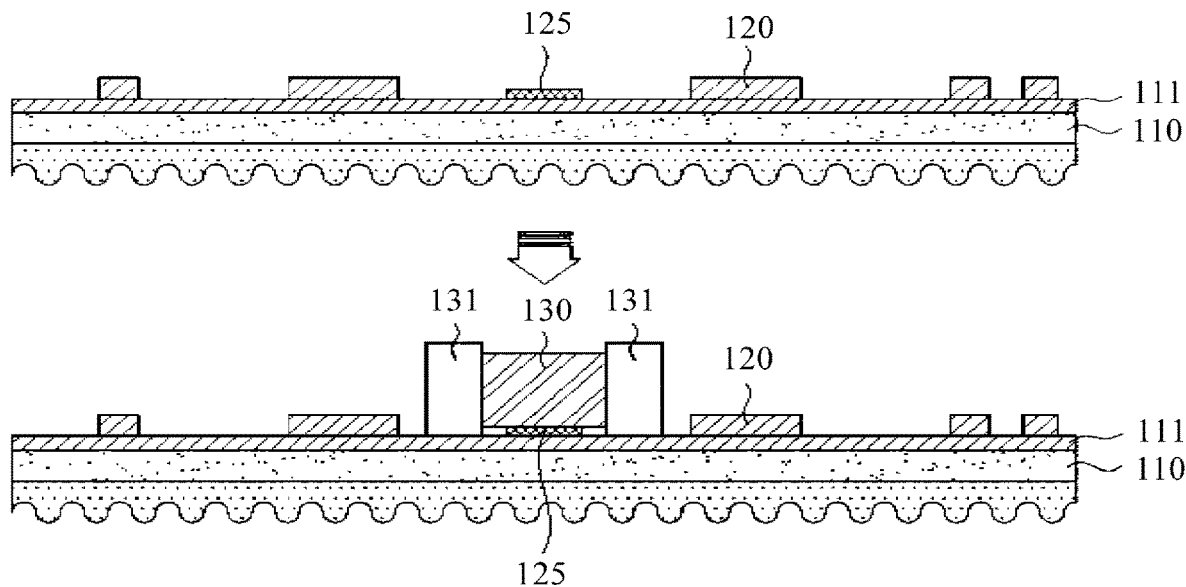

Next, as illustrated in FIG. 5C, an adhesive layer 125 is formed on a same plane of the carrier member 110 where the circuit layer 120 is formed. An electronic component 130 is installed on the adhesive layer 125. In this example, the adhesive layer 125 is formed using a non-conductive adhesive material in an area where the electronic component 130 is to be installed, on a same plane as the circuit layer 120, such that the electronic component 130 is sturdily adhered to the carrier member 110. In an embodiment, an area occupied by the adhesive layer 125 is minimized by controlling an amount of coating lest the adhesive layer 125 runs over to an area of a connection terminal of the electronic component 130.

The electronic component 130 is a component that is electrically connected with a printed circuit board to carry out a particular function. The electronic component 130 may be an active device, such as a semiconductor device, or a passive device, such as a capacitor, an inductor, or a resistor.

Figure 5D:
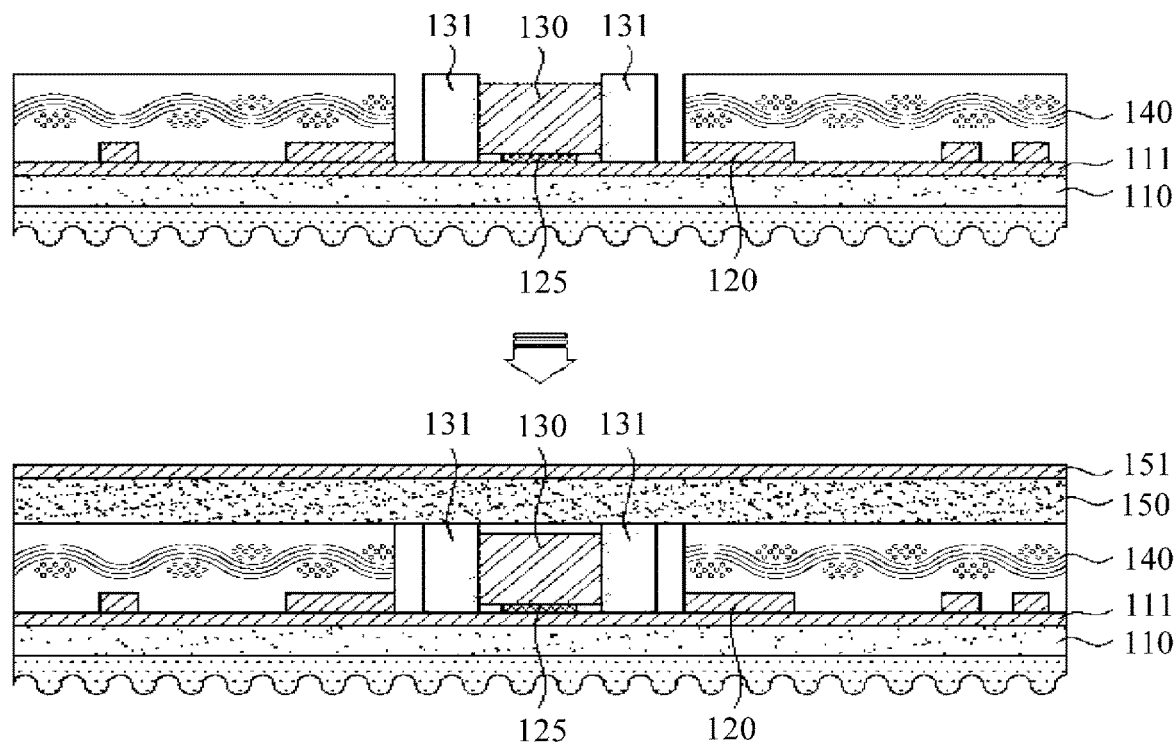

Afterwards, as illustrated in FIG. 5D, a first insulation layer 140 is formed, for example, using a prepreg. The electronic component 130 is installed in the first insulation layer 140 after punching the first insulation layer 140, at an area where the electronic component 130 is to be installed. In this example, the first insulation layer 140 is formed by processing a primary lay-up by pre-punching an insulation material at an area where a component is to be installed using a method of manufacturing a coreless type of printed circuit board.

Then, a second insulation layer 150 is formed on one surface of the first insulation layer 140 to embed and stabilize the electronic component 130 by being filled in a cavity formed at an area where the electronic component 130 is mounted in the first insulation layer 140. Accordingly, the second insulation layer 150 is made of an insulation material having a fluid property, for instance, a semi-hardened insulation material. In this example, the first insulation layer 140 and the second insulation layer 150 are formed as a prepreg layer. The first insulation layer 140 and the second insulation layer 150 may be made of a thermosetting or thermoplastic polymer material, a ceramic, an organic or inorganic composite material, or any resin having glass fiber impregnated therein. In an embodiment where the first insulation layer 140 and the second insulation layer 150 are made of a polymer resin, the polymer resin includes an epoxy insulation resin, for example, flame retardant 4 (FR-4), bismaleimide triazine (BT) or an ajinomoto build-up film (ABF). In an alternative embodiment, the polymer resin may include a polyimide resin.

In an embodiment, a seed layer 151 is formed on the second insulation layer 150.

The seed layer 151 is formed using an electroless copper plating process. In an alternative embodiment, the seed layer 151 is formed using a sputtering process or a chemical vapor deposition (CVD) process.

Figure 5E:
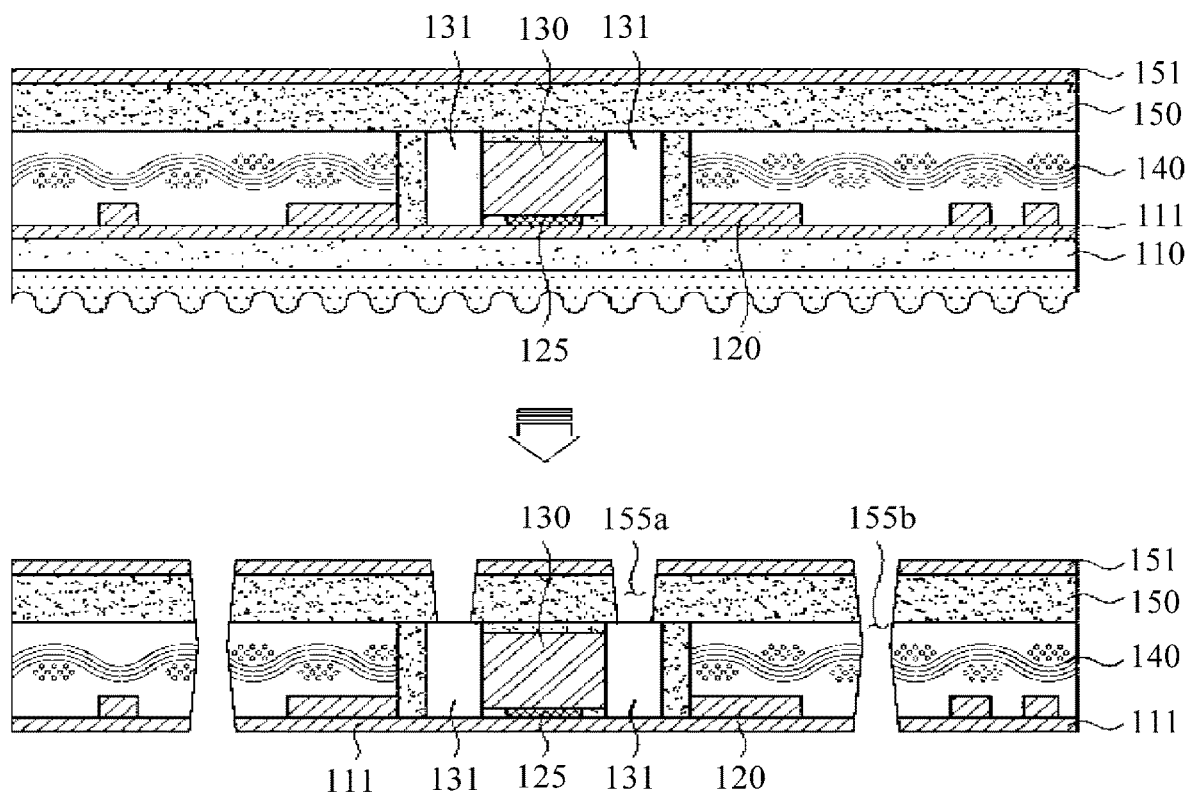

Then, as illustrated in FIG. 5E, after carrying out a lamination process by compressing the first insulation layer 140 and the second insulation layer 150 under a high temperature and a high pressure, the first insulation layer 140 and the second insulation layer 150 are drilled to form a via hole 155b and a micro via hole 155a, so as to allow the connection terminal of the electronic component 130 to be exposed. In this example, the via hole 155 is formed using a YAG laser or a $CO_2$ laser.

Figure 5F:
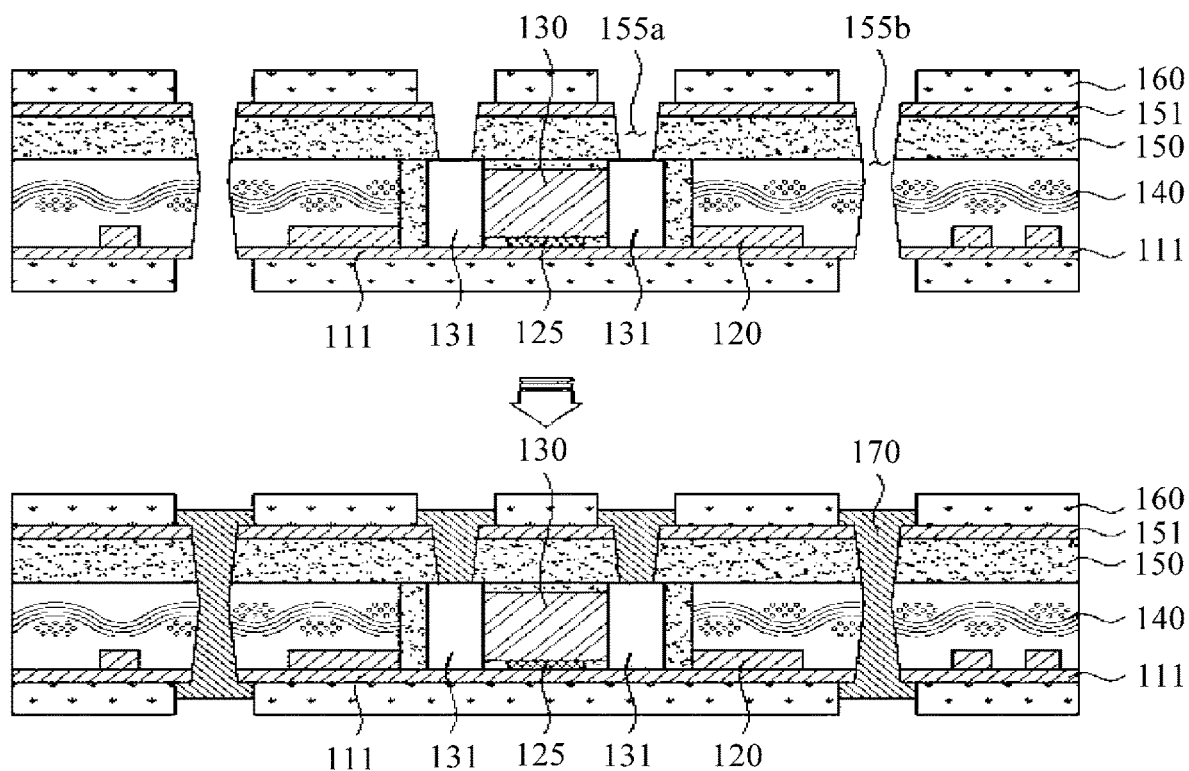

Next, as illustrated in FIG. 5F, after coating a second dry film 160 to pattern the via hole 155b and the opening to be exposed, a metallic material is filled in the via hole 155b and the opening to form an outer circuit layer 170. In this example, the outer circuit layer 170 including a via is formed through a semi-additive process (SAP) or a modified semi-additive process (MSAP). Moreover, the above described processes are examples of various embodiments and other circuit forming processes including a subtractive process, the SAP and the MSAP, may be used. In this example, the second dry film 160 functions as a plating resist, like the first dry film 112, and thus descriptions thereof have been provided with reference to FIG. 4B and will be omitted herein.

Figure 5G:
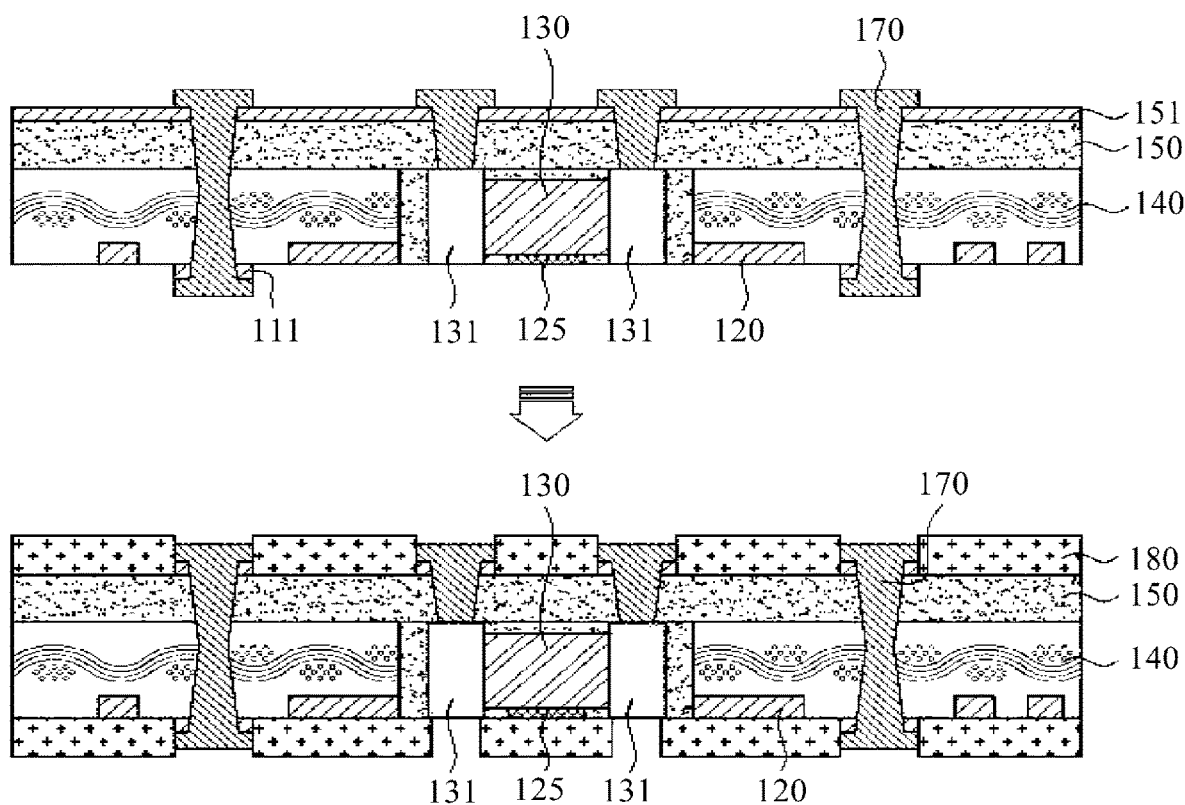

Thereafter, referring to FIG. 5G, once the outer circuit layer 170 is completely formed, the second dry film 160 and the seed layers 111, 151 are removed, and then a solder resist layer 180 is formed. In this example, the second dry film 160 is removed in the same manner as the first dry film 112.

Moreover, because electrolytic plating of the seed layers 111, 151 is not needed, the exposed seed layers 111, 151 are removed. The exposed seed layers 111, 151 is removed using soft etching lest an under-cut should occur.

The solder resist layer 180 includes openings at exposed surfaces of the first insulation layer 140 and the second insulation layer 150. In an embodiment, the openings of the solder resist layer 180 are formed through patterning, exposing, and developing a mask.

Figure 5H:
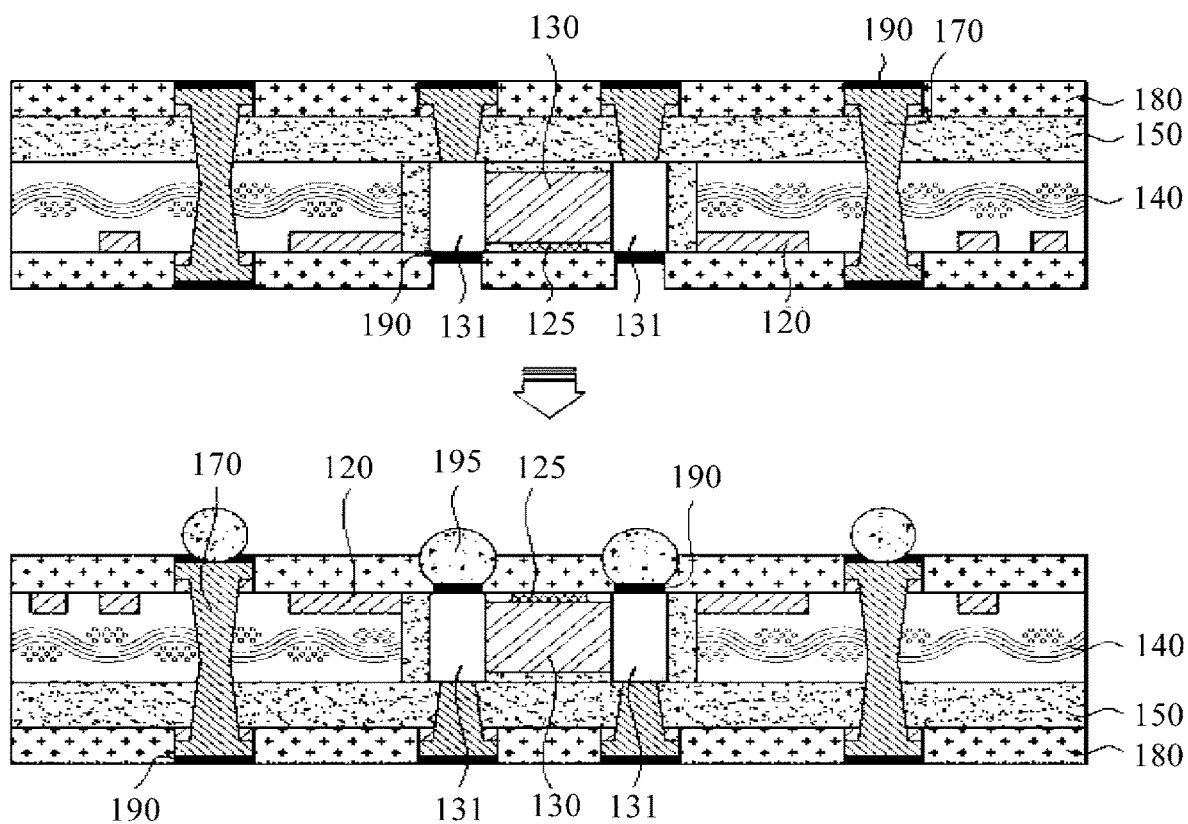

Lastly, as illustrated in FIG. 5H, a surface treatment layer 190 and a metal bump 195 are formed on the outer circuit layer 170 exposed to the openings of the solder resist layer 180.

In this example, the surface treatment layer 190 prevents the exposed outer circuit layer from oxidation and improves the solderability and conductivity of the electronic component 130 being installed. The surface treatment layer 190 is made of a gold plated film, an electrolytic gold plated film, an electroless gold plated film, or an electroless nickel immersion gold (ENIG) film.

The metal bump 195 is made of a conductive solder on the surface treatment layer 190 and is bonded with a chip above the metal bump 195 or with a bonding area of the substrate. In an embodiment, by allowing a bonding area of an external component, such as the chip above the metal bump 195 or the substrate, and the conductive solder of the metal bump 195 to be attached with each other through a thermal compression method at a predetermined temperature, the exposed connection terminal of the electronic component 130 is directly connected with the external component. As a result, a distance of signal transfer for better signal transfer is shorten and a signal loss is minimized during the signal transfer.

FIG. 6A through FIG. 6D illustrate processes used in another example of a method of manufacturing an electronic component embedded printed circuit board, in accordance with an embodiment. Cross-sectional views of the electronic component embedded printed circuit board are illustrated during a manufacturing process. In describing the method of manufacturing an electronic component embedded printed circuit board, according to an example, redundant processes described in connection with the above described example will be omitted herein.

Figure 6A:
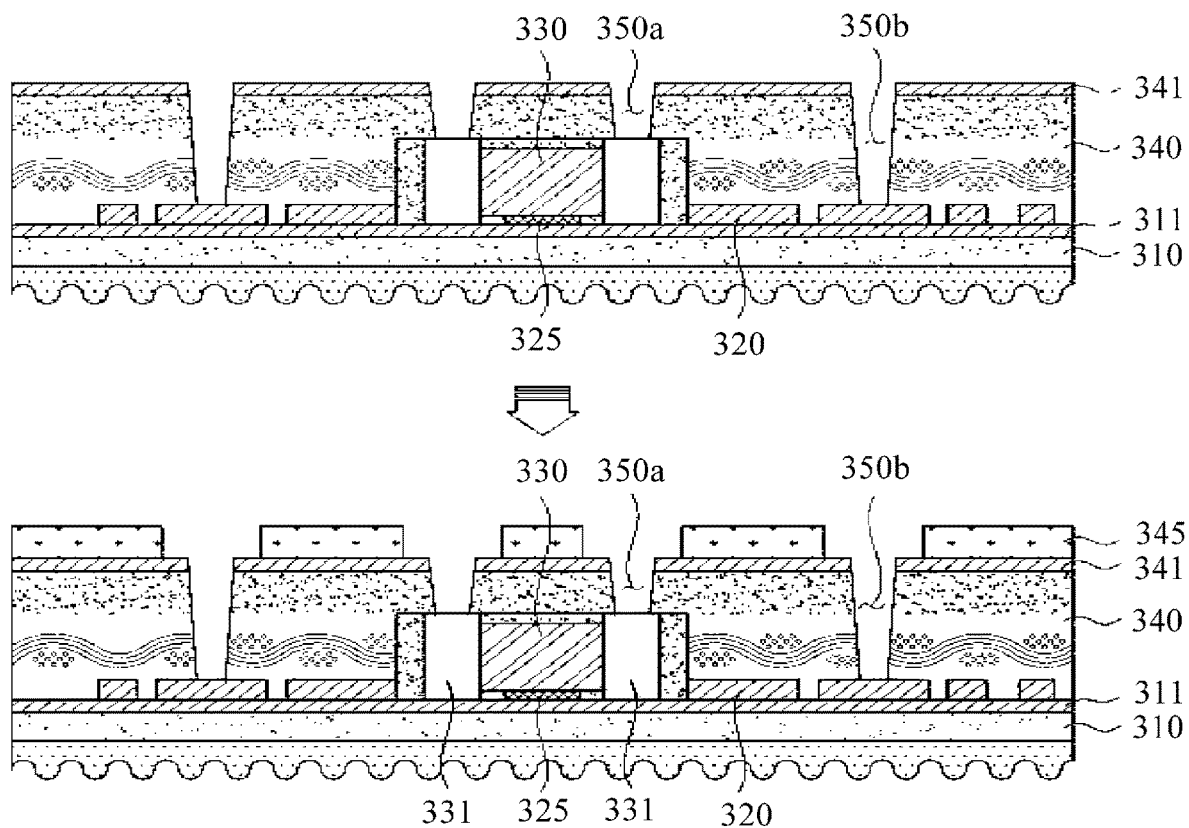
FIG. 6A through FIG. 6D illustrate processes used in another example of a method of manufacturing an electronic component embedded printed circuit board, in accordance with an embodiment.
Figure 6B:
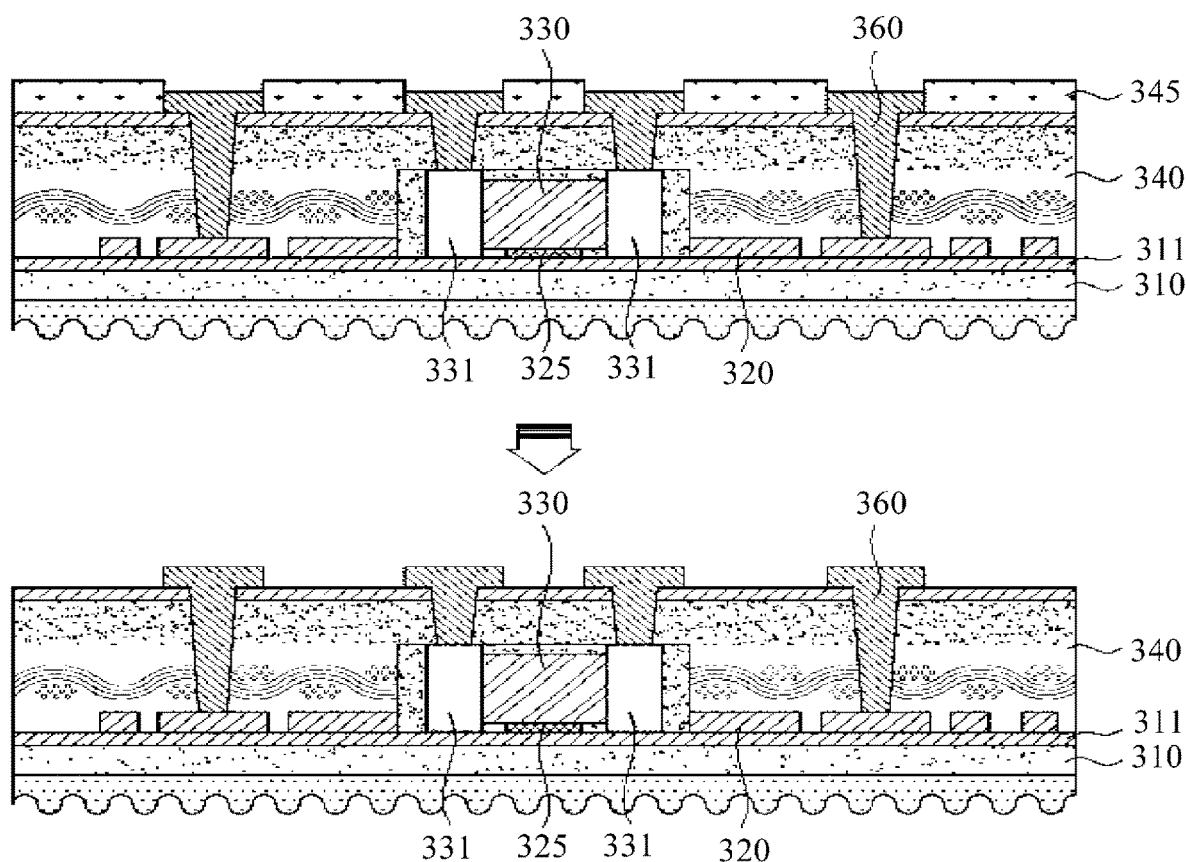
Figure 6C:
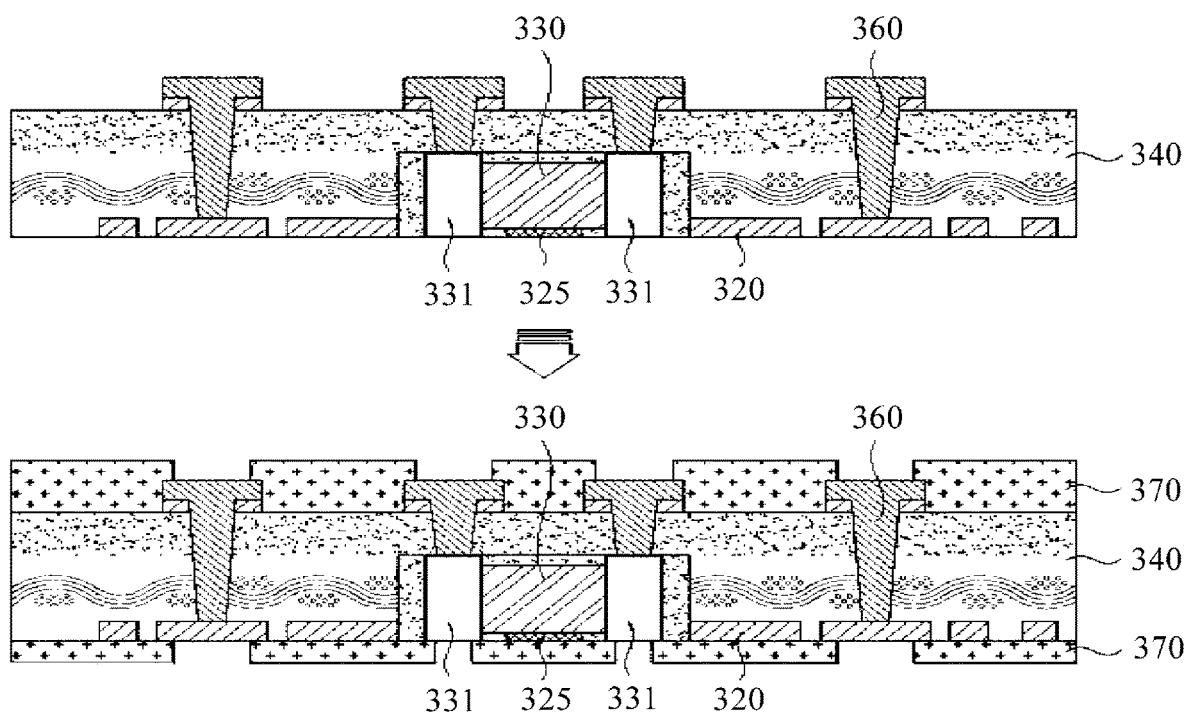
Figure 6D:
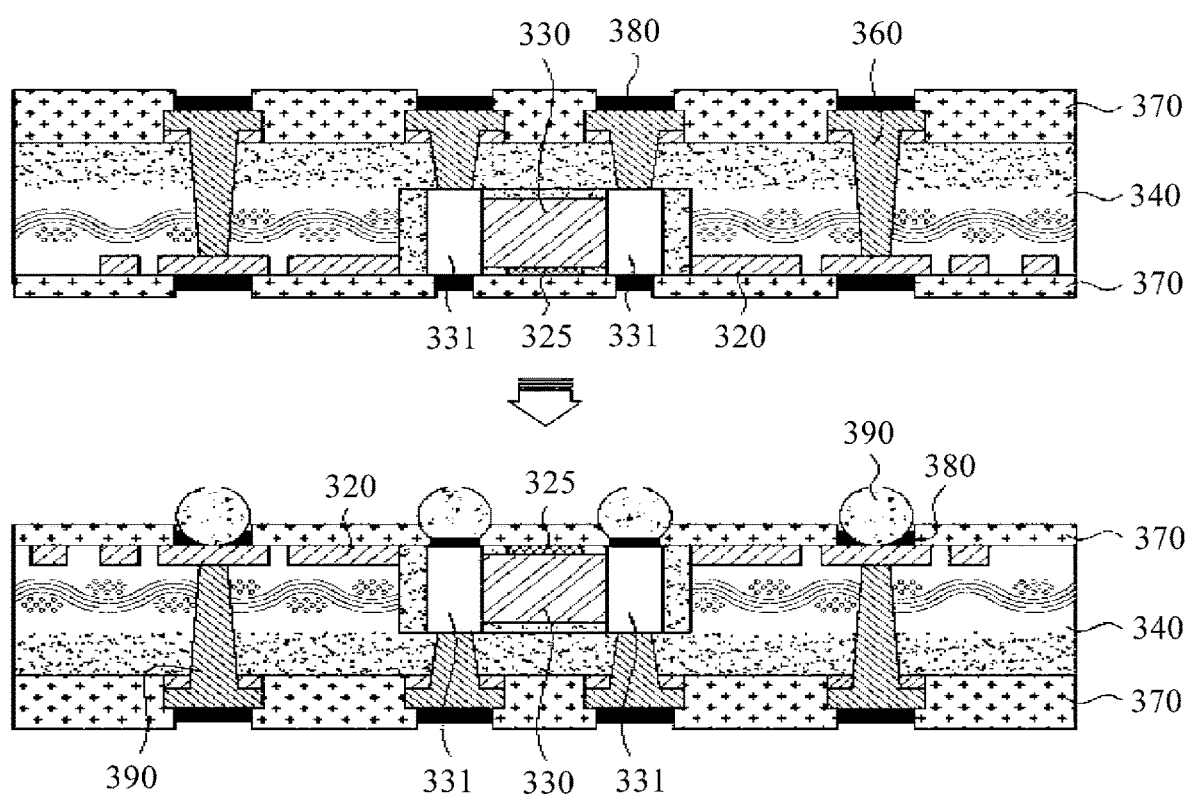

As illustrated in FIG. 6A, unlike the earlier-described example, an industrial via-holes (IVH) 155a and 155b are formed when a circuit is formed by pattern-plating a carrier having a thin copper foil, and then the same lamination process as that of the earlier-described example is performed.

Figure 7:
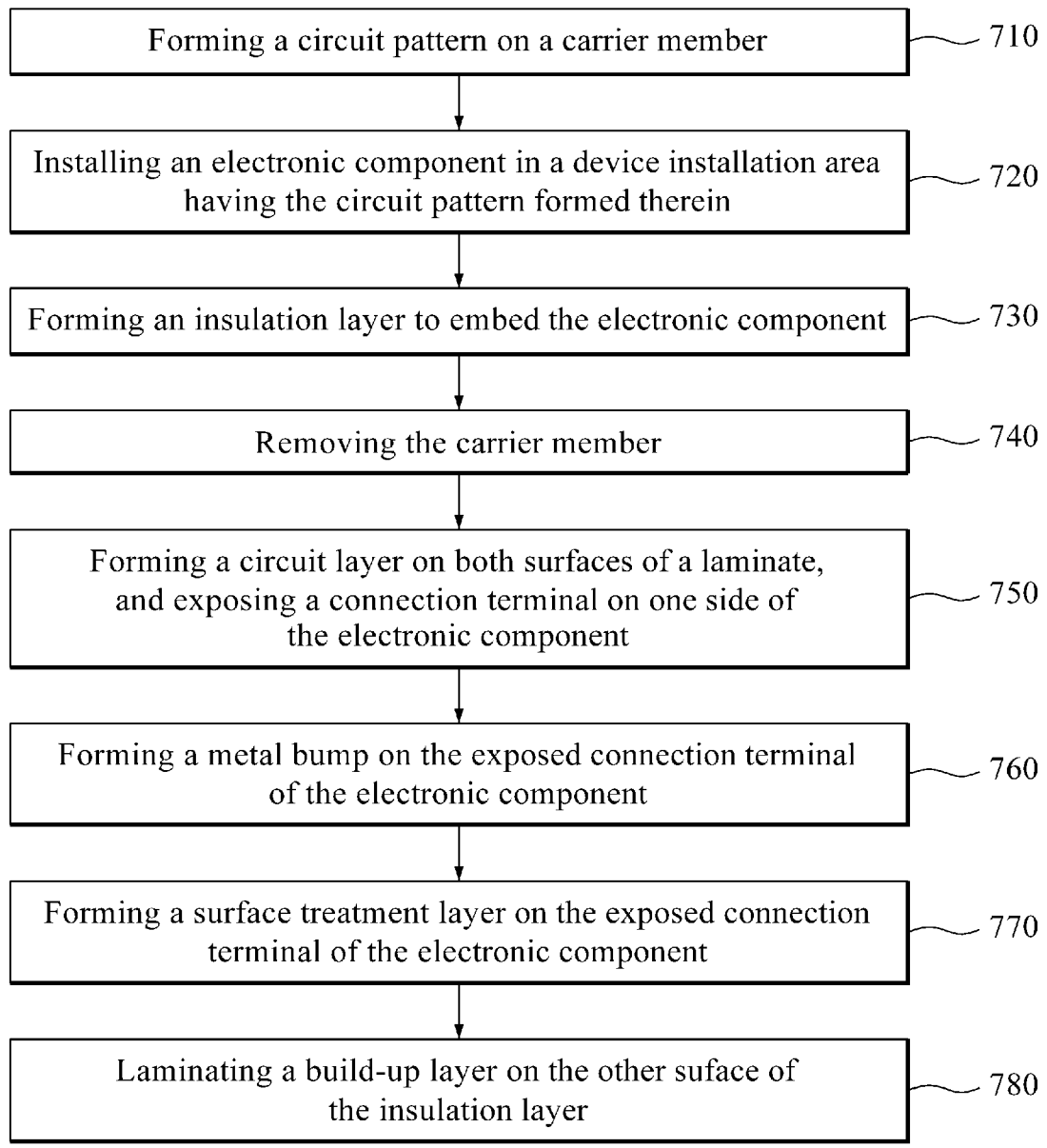
FIG. 7 illustrates a method of manufacturing an electronic component embedded printed circuit board, in accordance with an embodiment.

FIG. 7 illustrates a method of manufacturing an electronic component embedded printed circuit board, in accordance with an embodiment. The method includes, at operation 700, forming a circuit pattern on a carrier member. The forming of the circuit pattern includes, but is not limited to, forming a first dry film on the carrier member and then etching the first dry film in a predetermined pattern, filling a metallic material in the etched predetermined pattern, and removing the first dry film and then forming an adhesive layer in an area where the electronic component is to be formed.

At operation 720, the method installs an electronic component in a device installation area having the circuit pattern formed therein. At operation 730, the method forms an insulation layer such that the electronic component is embedded therein. The forming includes, but is not limited to, forming a first insulation layer on the carrier member so as to surround lateral surfaces of the electronic component, and forming a second insulation layer on the first insulation layer. At operation 740, the method removes the carrier member. At operation 750, the method forms a circuit layer on both surfaces of a laminate from which the carrier member is removed, and exposing a connection terminal on one side of the electronic component. The forming includes, but is not limited to, removing the carrier member and then processing a via hole including a micro via hole such that the connection terminal of the electronic component is exposed on the insulation layer, forming a second dry film on one surface and the other surface of the insulation layer, patterning the second dry film and such that the via hole is exposed, and filling a metallic material in the exposed via hole.

At operation 760, the method forms a metal bump on the exposed connection terminal of the electronic component. At operation 770, the method forms a surface treatment layer on the exposed connection terminal of the electronic component. At operation 780, the method laminates a build-up layer on the other surface of the insulation layer.

The electronic component embedded printed circuit board having this carrier applied thereto is formed including an even or odd number of multi-layers, for example, a multi-layered substrate having at least or more layers, after the carrier is separated.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board, comprising:
   an electronic component embedded in an insulation layer, and comprising connection terminals exposed on a surface of the insulation layer;
   a solder resist layer disposed directly on the surface of the insulation layer and comprising an opening exposing the connection terminals;
   an adhesive layer disposed between the electronic component and the solder resist layer, wherein the solder resist layer is disposed directly on the adhesive layer, and wherein the adhesive layer is disposed between and spaced apart from adjacent connection terminals of the electronic component;

a circuit layer embedded in the insulation layer, wherein the circuit layer is exposed on the surface of the insulation layer at a same level as the connection terminal; and a bump disposed on the connection terminals and exposed on the surface of the insulation layer.

2. The printed circuit board as set forth in claim 1, wherein a surface treatment layer is formed on the connection terminals.

3. The printed circuit board as set forth in claim 1, wherein the insulation layer is made of one of a thermosetting or thermoplastic polymer material, a ceramic, an organic or inorganic composite material, a glass fiber prepreg, flame retardant 4 (FR-4), bismaleimide triazine (BT), and an ajinomoto build-up film (ABF).

4. The printed circuit board as set forth in claim 1, further comprising:
a build-up layer laminated on another surface of the insulation layer.

5. The printed circuit board as set forth in claim 1, wherein the connection terminals extend along opposing vertical sides of the electronic component beyond a body of the electronic component to the surface of the insulation layer from a position embedded in the insulation layer.

6. The printed circuit board of claim 1, further comprising a via directly connected to the connection terminals exposed on another surface of the insulation layer.

7. The printed circuit board of claim 1, wherein the circuit layer is exposed on the surface of the insulation layer at a horizontally same level as the connection terminal.

8. A semiconductor package, comprising:
a printed circuit board comprising an electronic component embedded in an insulation layer, and comprising a connection terminal exposed on a surface of the insulation layer;
a solder resist layer disposed directly on the surface of the insulation layer and comprising an opening exposing the connection terminal;
an adhesive layer disposed between the electronic component and the solder resist layer, wherein the solder resist layer is disposed directly on the adhesive layer, and wherein the adhesive layer is disposed spaced apart from and adjacent to the connection terminal of the electronic component;
a bump disposed on the connection terminal and exposed on the surface of the insulation layer;
a circuit layer embedded in the insulation layer, wherein the circuit layer is exposed on the surface of the insulation layer at a same level as the connection terminal; and
a first device connected to the bump.

9. The semiconductor package as set forth in claim 8, further comprising:
a second device formed on the first device and wire-bonded with a circuit layer of the printed circuit board.

10. The semiconductor package as set forth in claim 8, wherein the connection terminal extends along a vertical side of the electronic component to the surface of the insulation layer from a position embedded in the insulation layer.

11. The semiconductor package of claim 8, wherein the circuit layer is exposed on the surface of the insulation layer at a horizontally same level as the connection terminal.

12. A printed circuit board, comprising:
an electronic component embedded in an insulation layer, and comprising a connection terminal exposed on a surface of the insulation layer;
a solder resist layer disposed directly on the surface of the insulation layer and comprising an opening exposing the connection terminal;
a circuit layer embedded in the insulation layer, wherein the circuit layer is exposed on the surface of the insulation layer at a same level as the connection terminal;
a bump disposed on the connection terminal and exposed on the surface of the insulation layer; and
an adhesive layer disposed between the electronic component and the solder resist layer,
wherein the adhesive layer is disposed spaced apart from and adjacent to the connection terminal of the electronic component.

13. The printed circuit board of claim 12, wherein the circuit layer is exposed on the surface of the insulation layer at a horizontally same level as the connection terminal.

\* \* \* \* \*